(12) United States Patent
Jia et al.

(10) Patent No.: US 12,238,853 B2
(45) Date of Patent: Feb. 25, 2025

(54) HEAT SINK AND ELECTRONIC DEVICE

(71) Applicant: HUAWEI TECHNOLOGIES CO., LTD., Guangdong (CN)

(72) Inventors: Hui Jia, Shenzhen (CN); Xinhu Gong, Shenzhen (CN); Dingfang Li, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 137 days.

(21) Appl. No.: 18/191,946

(22) Filed: Mar. 29, 2023

(65) Prior Publication Data

US 2023/0239995 A1 Jul. 27, 2023

Related U.S. Application Data

(63) Continuation of application No. PCT/CN2021/121849, filed on Sep. 29, 2021.

(30) Foreign Application Priority Data

Sep. 30, 2020 (CN) .......................... 202011062856.3

(51) Int. Cl.
H05K 1/02 (2006.01)
(52) U.S. Cl.
CPC ........... H05K 1/021 (2013.01); H05K 1/0204 (2013.01)
(58) Field of Classification Search
CPC .. H05K 7/20; H05K 7/20254; H05K 7/20263; H05K 7/20272; H05K 7/20327; H05K 7/2039; H05K 7/20436; H05K 7/20509; H05K 7/20772; H05K 1/0203; H05K 1/0204; H05K 1/021; G06F 1/20; G06F 1/206

See application file for complete search history.

(56) References Cited

U.S. PATENT DOCUMENTS

| | | | |
|---|---|---|---|
| 10,842,043 B1* | 11/2020 | Zhang | H05K 7/20254 |
| 2006/0050483 A1* | 3/2006 | Wilson | H01L 23/473 |
| | | | 361/689 |
| 2012/0106083 A1* | 5/2012 | Toftloekke | H01L 23/473 |
| | | | 361/698 |
| 2017/0339802 A1* | 11/2017 | Pan | F28D 15/00 |
| 2019/0053403 A1* | 2/2019 | Lin | H01L 23/427 |
| 2020/0185306 A1* | 6/2020 | Xiao | H01L 23/467 |
| 2021/0385970 A1* | 12/2021 | Su | G01M 3/3263 |
| 2022/0110224 A1* | 4/2022 | Gong | H01L 23/473 |
| 2023/0254995 A1* | 8/2023 | Robinson | H05K 7/20254 |
| | | | 361/699 |

* cited by examiner

Primary Examiner — Amir A Jalali

(57) ABSTRACT

A heat sink includes: a first heat dissipation module in thermal contact with the first heat source; a heat dissipation base in thermal contact with the second heat source, where the heat dissipation base is fixed on the circuit board, the first heat dissipation module is floatingly fixed on the heat dissipation base, and the heat dissipation base is provided with a first opening; and a second heat dissipation module, disposed between the first heat dissipation module and the heat dissipation base, where the second heat dissipation module is fixed on the heat dissipation base, the second heat dissipation module is provided with a second opening corresponding to the first opening, and the first heat dissipation module sequentially runs through the second opening and the first opening to be in thermal contact with the first heat source.

20 Claims, 14 Drawing Sheets

HEAT SINK AND ELECTRONIC DEVICE

CROSS-REFERENCE TO RELATED APPLICATIONS

This application is a continuation of International Application No. PCT/CN2021/121849, filed on Sep. 29, 2021, which claims priority to Chinese Patent Application No. 202011062856.3, filed on Sep. 30, 2020. The disclosures of the aforementioned applications are hereby incorporated by reference in their entireties.

TECHNICAL FIELD

This disclosure relates to the field of heat dissipation of electronic devices, and in particular, to a heat sink and an electronic device using the heat sink.

BACKGROUND

With improvement of a hardware integration level, a quantity of chips and components integrated on a circuit board in an electronic device keeps increasing. The chips and components generate a large amount of heat during operation of the electronic device. To avoid impact of the heat on the chips and components, an integral cold plate is usually used to synchronously take away heat from the chips and auxiliary devices. However, because a large quantity of chips and components are arranged on the circuit board, the integral cold plate needs to keep close contact with surfaces of the chips and components. Because mounting heights of the chips and components are not completely the same, a heat conduction structure between the cold plate and the chips and components is complex, and it is difficult to implement efficient heat dissipation.

SUMMARY

In view of this, it is necessary to provide a heat sink and an electronic device that can effectively dissipate heat for chips and components with different heights on a circuit board.

A first aspect of embodiments of this disclosure provides a heat sink, used in an electronic device. The electronic device includes a first heat source and a second heat source that are disposed on a circuit board. The heat sink includes: a first heat dissipation module in thermal contact with the first heat source; a heat dissipation base in thermal contact with the second heat source, where the heat dissipation base is fixed on the circuit board, the first heat dissipation module is floatingly fixed on the heat dissipation base, and the heat dissipation base is provided with a first opening; and a second heat dissipation module, disposed between the first heat dissipation module and the heat dissipation base, where the second heat dissipation module is fixed on the heat dissipation base, the second heat dissipation module is provided with a second opening corresponding to the first opening, and the first heat dissipation module sequentially runs through the second opening and the first opening to be in thermal contact with the first heat source.

Optionally, the first heat dissipation module and the second heat dissipation module are both liquid cooling structures. The liquid cooling structure can effectively improve heat dissipation efficiency of the heat sink.

Optionally, the first heat dissipation module includes a cover plate, a cooling cavity, and a cooling plate, the cooling cavity is disposed between the cover plate and the cooling plate, the cover plate is fixedly connected to the cooling plate, and the cover plate is provided with a first working substance input/output interface in communication with the cooling cavity. The first heat dissipation module has a simple structure and is convenient to assemble.

Optionally, the second heat dissipation module is provided with a second working substance input/output interface, and the first working substance input/output interface is in communication with the second working substance input/output interface by using a flexible hose.

Optionally, the second heat dissipation module is further provided with a third working substance input/output interface, and the third working substance input/output interface is configured to connect to an external working substance circulation system. The first heat dissipation module is in communication with the second heat dissipation module, and the second heat dissipation module is connected to the external working substance circulation system, so that settings of the circulation system can be reduced, the structure is simple, and heat dissipation efficiency is high.

Optionally, the third working substance input/output interface is connected to a connector, the connector includes a first cavity and a first valve plug disposed at an inlet/outlet of the first cavity, the first valve plug is connected to a bottom wall of the first cavity by using a first elastic structure, the first valve plug is blocked at the inlet/outlet of the first cavity under an abutting action of the first elastic structure to make the connector closed, and the first valve plug can exit from the inlet/outlet of the first cavity under an action of external force to conduct the connector.

Optionally, the heat dissipation base is provided with a first thermally conductive plate, the second heat dissipation module is provided with a second thermally conductive plate corresponding to the first thermally conductive plate, and the first thermally conductive plate is in thermal contact with the second thermally conductive plate. By disposing the first thermally conductive plate and the second thermally conductive plate, efficiency of heat conduction between the heat dissipation base and the second heat dissipation module can be further improved.

Optionally, an elastic thermally conductive block is further disposed between the first thermally conductive plate and the second thermally conductive plate, and the first thermally conductive plate is in thermal contact with the second thermally conductive plate by using the elastic thermally conductive block. The elastic thermally conductive block can not only implement good thermal contact between the first thermally conductive plate and the second thermally conductive plate, but also buffer interaction force between the second heat dissipation module and the heat dissipation base.

Optionally, the elastic thermally conductive block is U-shaped. The U-shaped thermally conductive block has a simple structure, and can further buffer the interaction force between the second heat dissipation module and the heat dissipation base.

Optionally, a heat pipe is disposed between the second heat dissipation module and the heat dissipation base, one end of the heat pipe is connected to the second heat dissipation module, and the other end is connected to the heat dissipation base. Efficiency of heat conduction between the heat dissipation base and the second heat dissipation module is further improved by using temperature uniformity of the heat pipe.

Optionally, the heat pipe is U-shaped and is deformable in a direction perpendicular to a thermally conductive surface of the heat dissipation base. The U-shaped heat pipe has a simple structure, so that not only a length of the heat pipe can be increased, but also the interaction force between the second heat dissipation module and the heat dissipation base can be further buffered.

Optionally, the first heat dissipation module is in thermal contact with the first heat source by using a thermal interface material; and the heat dissipation base is in thermal contact with the second heat source by using a thermal pad. The thermal interface material can further improve heat conduction efficiency, and the thermal pad can better implement good thermal contact between the heat dissipation base and second heat sources with different heights.

Optionally, the first heat dissipation module is floatingly disposed on the heat dissipation base by using a floating bolt. The floating bolt is used for floating fixation, so that pressure applied by the first heat dissipation module to the first heat source can be effectively buffered, and unnecessary damage caused by the pressure is avoided.

Another aspect of embodiments of this disclosure provides an electronic device, including a circuit board and a first heat source and a second heat source that are disposed on the circuit board, where the electronic device further includes the foregoing heat sink.

The electronic device provided in this embodiment of the present invention has the same technical effect as the heat sink provided in the foregoing embodiment, and details are not described herein again.

Optionally, the first heat source is a high-power chip; and the second heat source includes a storage element and/or a power supply device.

Optionally, a carrier plate is further included, where the circuit board is disposed on the carrier plate by using a bracket.

Optionally, a quick-connect apparatus is disposed on the carrier plate, and the quick-connect apparatus is in communication with the second heat dissipation module and a liquid cooling circulation system. The second heat dissipation module is detachably connected to the liquid cooling circulation system by using the quick-connect apparatus, to implement structural decoupling, facilitate dismounting and mounting, and facilitate maintenance.

Optionally, the quick-connect apparatus includes a first connector and a second connector, the second heat dissipation module includes a third connector and a fourth connector, the third connector is correspondingly connected to the first connector, and the fourth connector is correspondingly connected to the second connector.

Optionally, the first connector includes a first cavity and a first valve plug disposed at an inlet/outlet of the first cavity, the first valve plug is connected to a bottom wall of the first cavity by using a first elastic structure, the first valve plug is blocked at the inlet/outlet of the first cavity under an abutting action of the first elastic structure to make the first connector closed, and the first valve plug can exit from the outlet of the first cavity under an action of external force to conduct the first connector. By using this structural setting, the first connector can implement quick conduction and closing.

Optionally, the third connector includes a second cavity and a third cavity that are in communication with each other, and a second valve plug disposed at an inlet/output of the second cavity, the second valve plug is connected to a bottom wall of the second cavity by using a second elastic structure, the second valve plug is blocked at the inlet/outlet of the second cavity under an abutting action of the second elastic structure to make the third connector closed, when the second heat dissipation module is fixed on the carrier plate, the first connector part can be partially accommodated in the third cavity, and the first valve plug and the second valve plug abut against each other, so that the first valve plug exits from the inlet/outlet of the first cavity, and the second valve plug exits from the inlet/outlet of the second cavity, to conduct the first connector and the third connector. By using this structural setting, the first connector and the third connector are automatically conducted when being connected, and are automatically closed when being disconnected. The structure is simple, and is easy to implement.

A connector assembly includes a first connector, the first connector includes a first cavity and a first valve plug, the first cavity is provided with a first inlet/outlet and a second inlet/outlet, when the first connector is conducted, a liquid working substance can flow into the first cavity through one of the first inlet/outlet and the second inlet/outlet, and flow out of the first cavity through the other of the first inlet/outlet and the second inlet/outlet, the first valve plug is connected to a bottom wall of the first cavity by using a first elastic structure, the first valve plug is blocked at the second inlet/outlet under an abutting action of the first elastic structure to make the first connector closed, and the first valve plug can compress the first elastic structure under an action of external force, and exit from the second inlet/outlet to conduct the first connector.

Optionally, the first connector further includes a second cavity, and the second cavity is in communication with the first cavity by using the second inlet/outlet. By disposing the second cavity, aligned connection and fixation between the second connector and the first connector are facilitated.

Optionally, a second connector is further included, the second connector can be at least partially accommodated in the second cavity, and when the second connector is partially accommodated in the second cavity, the second connector can be pushed against the first valve plug to conduct the first connector and the second connector. By using this structural setting, the first connector can be automatically closed and conducted.

Optionally, the second connector includes a third cavity and a second valve plug, the third cavity is provided with a third inlet/outlet and a fourth inlet/outlet, when the second connector is conducted, a liquid working substance can flow into the second cavity through one of the third inlet/outlet and the fourth inlet/outlet, and flow out of the second cavity through the other of the third inlet/outlet and the fourth inlet/outlet, the second valve plug is connected to a bottom wall of the second cavity by using a second elastic structure; and the second valve plug is blocked at the fourth inlet/outlet under an abutting action of the second elastic structure to make the second connector closed, the second valve plug can compress the second elastic structure under an action of external force and exit from the fourth inlet/outlet to conduct the second connector, and when the second connector is partially accommodated in the second cavity, the second valve plug and the first valve plug can be pushed against each other to conduct the first connector and the second connector simultaneously. By using this structural setting, the first connector and the second connector can be automatically closed and conducted.

A heat sink assembly includes a liquid cooling heat sink, where the liquid cooling heat sink includes a liquid working substance accommodation cavity, the heat sink assembly further includes the connector assembly, and the first cavity is in communication with the liquid working substance accommodation cavity.

A heat dissipation system includes a first liquid working substance channel and a second liquid working substance channel, and further includes a first connector in communication with the first liquid working substance channel and a second connector in communication with the second liquid working substance channel, the first connector includes a first cavity and a first valve plug, the first cavity is provided with a first inlet/outlet and a second inlet/outlet, when the first connector is conducted, a liquid working substance can flow into the first cavity through one of the first inlet/outlet and the second inlet/outlet, and flow out of the first cavity through the other of the first inlet/outlet and the second inlet/outlet, the first valve plug is connected to a bottom wall of the first cavity by using a first elastic structure, the first valve plug is blocked at the second inlet/outlet under an abutting action of the first elastic structure to make the first connector closed, and the first valve plug can compress the first elastic structure under an action of external force, and exit from the second inlet/outlet to conduct the first connector.

Optionally, the first connector further includes a second cavity, and the second cavity is in communication with the first cavity by using the second inlet/outlet.

Optionally, the second connector can be at least partially accommodated in the second cavity, and when the second connector is partially accommodated in the second cavity, the second connector can be pushed against the first valve plug to conduct the first connector and the second connector.

Optionally, the second connector includes a third cavity and a second valve plug, the third cavity is provided with a third inlet/outlet and a fourth inlet/outlet, when the second connector is conducted, a liquid working substance can flow into the second cavity through one of the third inlet/outlet and the fourth inlet/outlet, and flow out of the second cavity through the other of the third inlet/outlet and the fourth inlet/outlet, the second valve plug is connected to a bottom wall of the second cavity by using a second elastic structure, the second valve plug is blocked at the fourth inlet/outlet under an abutting action of the second elastic structure to make the second connector closed, the second valve plug can compress the second elastic structure under an action of external force and exit from the fourth inlet/outlet to conduct the second connector, and when the first connector is fixedly connected to the second connector, the second valve plug and the first valve plug can be pushed against each other to conduct the first connector and the second connector simultaneously.

Figure 1:
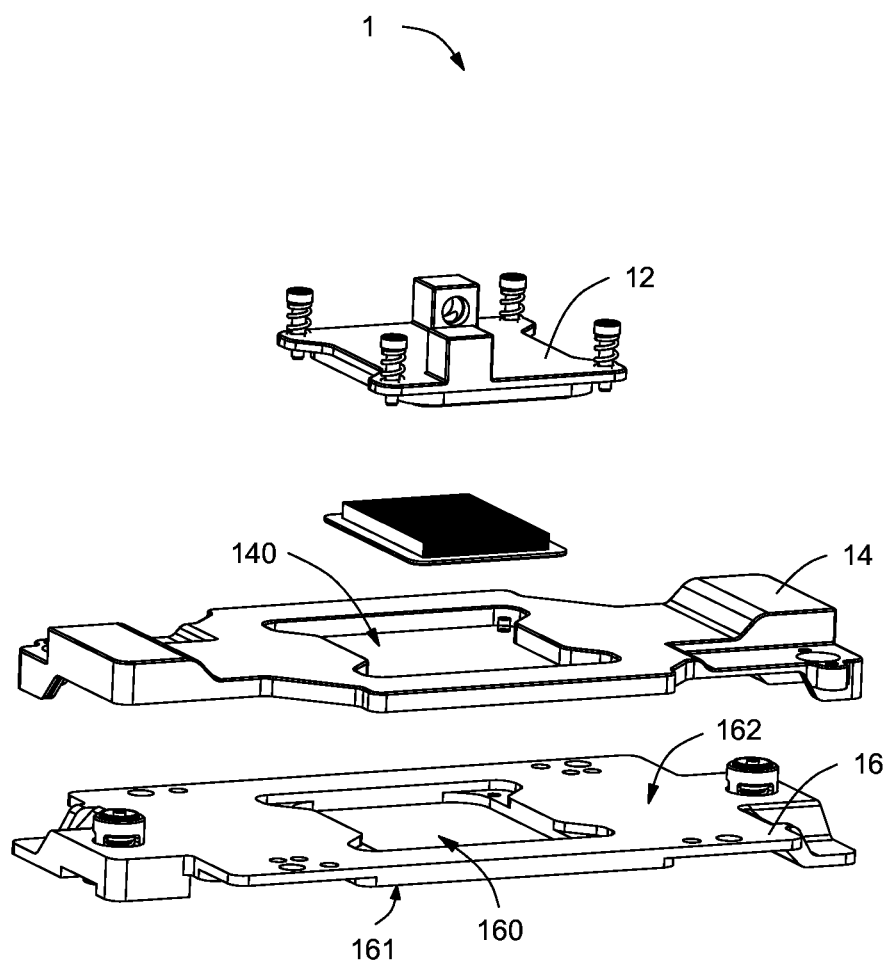
FIG. 1 is a schematic diagram of a structure of a heat sink according to a first embodiment of the present invention.

| Description of main reference numerals | |
|---|---|
| Heat sink | 1 |
| First heat dissipation module | 12 |
| Cover plate | 120 |
| First thermally conductive surface | 121 |
| Cooling cavity | 122 |
| Cooling plate | 124 |
| First working substance input/output interface | 125 |
| First working substance connector | 126 |
| First positioning hole | 128 |
| Floating bolt | 13 |
| Stud | 131 |
| Elastic member | 133 |
| Second heat dissipation module | 14 |
| Second opening | 140 |
| Second working substance input/output interface | 142 |
| Third connector | 1420 |
| Fourth connector | 1421 |
| Second cavity | 1423 |
| Third cavity | 1424 |
| Second valve plug | 1425 |
| Second blocking part | 14250 |
| Second abutting part | 14251 |
| Second connecting piece | 14252 |
| Second elastic structure | 1426 |
| Third working substance input/output interface | 143 |
| Second working substance connector | 144 |
| Quick-connect apparatus | 15 |
| Locking apparatus | 150 |
| First connector | 151 |
| First cavity | 1510 |
| First valve plug | 1512 |
| First blocking part | 15120 |
| First abutting part | 15121 |
| First connecting piece | 15122 |
| First elastic structure | 1513 |
| Fifth connector | 152 |
| Second connector | 153 |
| Sixth connector | 154 |
| Positioning pin | 155 |
| Heat dissipation base | 16 |
| First opening | 160 |
| Second thermally conductive surface | 161 |
| Bearing surface | 162 |
| Second positioning hole | 163 |
| Third positioning hole | 164 |
| First thermally conductive plate | 165 |

-continued

| Description of main reference numerals | |
| --- | --- |
| Elastic thermally conductive block | 166 |
| Fixing part | 1660 |
| Connection part | 1662 |
| Heat pipe | 167 |
| Flexible hose | 17 |
| Electronic device | 2 |
| Circuit board | 20 |
| First heat source | 22 |
| Second heat source | 24 |
| Bracket | 25 |
| Carrier plate | 26 |

The present invention is further described in the following specific implementations with reference to the accompanying drawings.

DESCRIPTION OF EMBODIMENTS

The following clearly describes the technical solutions in embodiments of the present invention with reference to the accompanying drawings in embodiments of the present invention. It is clear that the described embodiments are merely some rather than all of embodiments of the present invention. Based on embodiments of the present invention, all other embodiments obtained by those of ordinary skill in the art without creative effort fall within the protection scope of the present invention.

Unless otherwise defined, all technical and scientific terms used in this specification have the same meanings as those generally understood by a person skilled in the art of the present invention. Terms used in this specification of the present invention are merely for the purpose of describing specific embodiments, but are not intended to limit the present invention.

Hereinafter, the terms "first", "second", and the like are used only for description, and cannot be understood as indicating or implying relative importance or implicitly indicating a quantity of indicated technical features. Therefore, the features defining "first", "second", and the like may explicitly or implicitly include one or more of the features. In the descriptions of this disclosure, unless otherwise stated, "a plurality of" means two or more than two. Orientation terms such as "up", "down", "left", and "right" are defined relative to orientations of components schematically placed in the accompanying drawings. It should be understood that, these directional terms are relative concepts. They are intended to provide relative description and clarification and may vary correspondingly based on changes of the orientations in which the components in the accompanying drawings are placed.

In this disclosure, unless otherwise expressly specified and limited, the term "connection" should be understood broadly. For example, the "connection" may be a fixed connection, a detachable connection, or an integral connection; or may be a direct connection, or an indirect connection by using an intermediate medium. The term "and/or" used in this specification includes any and all combinations of one or more related listed items.

A heat sink provided in embodiments of this disclosure is used in an electronic device. The electronic device may be any electronic device on which a circuit board carrying a chip is disposed, for example, a notebook computer, a server, or an electronic device with artificial intelligence (AI). The heat sink is configured to be in thermal contact with the chip on the circuit board, to take away heat generated by the chip.

At least one master chip and at least one peripheral device are disposed on the circuit board. The master chip is a high-power device, including but not limited to a central processing unit (CPU) and a network processing unit (NPU). The peripheral device may be a low-power chip or another electronic component, including but not limited to a storage component such as a double data rate (DDR) storage component, or a power supply component such as a voltage regulator down (VRD) module, a voltage regulator module (VRM), or a VDM. For ease of description, the master chip is defined as a first heat source, and the peripheral device is defined as a second heat source.

Because heights (vertical sizes relative to a plane in which the circuit board is located) of the first heat source and the second heat source on the circuit board are different, when an integral cold plate type heat sink is used for heat dissipation, thermal pads with different thicknesses are usually used to adapt to different distances between a thermal contact surface of the integral plate type heat sink and thermal contact surfaces of the first heat source and the second heat source. However, in one aspect, an excessively thick thermal pad may cause a decrease in heat dissipation performance; and in another aspect, the excessively thick thermal pad may cause different degrees of pressure to the first heat source and the second heat source. The pressure may cause damage to the chip or the peripheral device.

In a related technology, heat sinks that are independent of each other are respectively used for the first heat source and the second heat source. However, for a circuit board with high component integration density, when heat sinks are designed and mounted, a complex structure and a mounting difficulty are caused, affecting layout density of the circuit board.

With respect to the heat sink provided in embodiments of this disclosure, a heat sink of the first heat source and a heat sink of the second heat source are designed separately, and are detachably connected together, so that heat dissipation can be performed on the first heat source and the second heat source synchronously, the structure is simple, and is convenient to mount, and layout density of the circuit board is not affected.

The heat sink provided in embodiments of this disclosure includes a first heat dissipation module in thermal contact with the first heat source, a heat dissipation base in thermal contact with the second heat source, and a second heat dissipation module disposed between the first heat dissipation module and the heat dissipation base. The heat dissipation base is fixed on the circuit board, the first heat dissipation module is floatingly fixed on the heat dissipation base, and the heat dissipation base is provided with a first opening. The second heat dissipation module is fixed on the heat dissipation base, and is provided with a second opening corresponding to the first opening, the first heat dissipation module sequentially runs through the second opening, and the first opening is in thermal contact with the first heat source.

The heat sink takes away heat of the first heat source by using the first heat dissipation module, and takes away heat of the second heat source by using the heat dissipation base. The first heat dissipation module and the second heat dissipation module are designed separately, and the second heat dissipation module is further used to assist in heat dissipation. The first heat dissipation module and the second heat dissipation module are both disposed on the heat dissipation base, and only the heat dissipation base needs to be floatingly fixed on the circuit board. The structure is simple, and is convenient to mount, and layout density of the circuit board is not affected.

The following further describes embodiments of the present invention with reference to the accompanying drawings.

Figure 2:
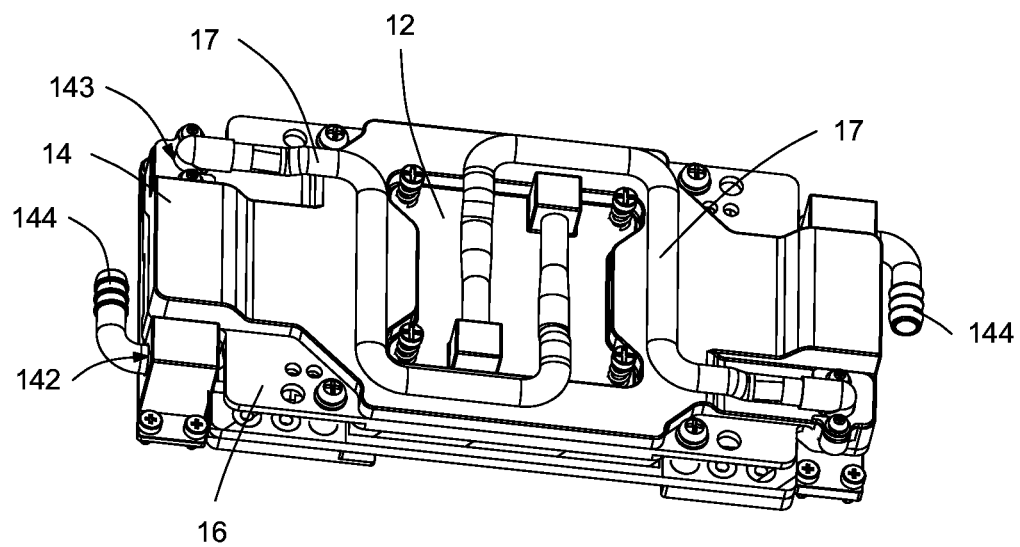
FIG. 2 is a schematic diagram of a structure of the heat sink shown in FIG. 1 assembled on a circuit board.

FIG. 1 and FIG. 2 show a heat sink 1 according to an embodiment of the present invention. The heat sink 1 includes a first heat dissipation module 12, a second heat dissipation module 14, and a heat dissipation base 16. The first heat dissipation module 12 is configured to be in thermal contact with a first heat source to take away heat generated by the first heat source. The heat dissipation base 16 is configured to be in thermal contact with a second heat source to take away heat generated by the second heat source. The first heat dissipation module 12 and the second heat dissipation module 14 are both disposed on the heat dissipation base 16. The heat dissipation base 16 is provided with a first opening 160, the second heat dissipation module 14 is provided with a second opening 140 corresponding to the first opening 160, and the first heat dissipation module 12 sequentially runs through the second opening 140 and the first opening 160 to be in thermal contact with the first heat source.

The first heat dissipation module 12 may be a structure in which a liquid cooling working substance can be accommodated, for example, a cold plate or a vapor chamber. The liquid cooling working substance may be water or a mixture of water and anti-freezing liquid.

Figure 3:
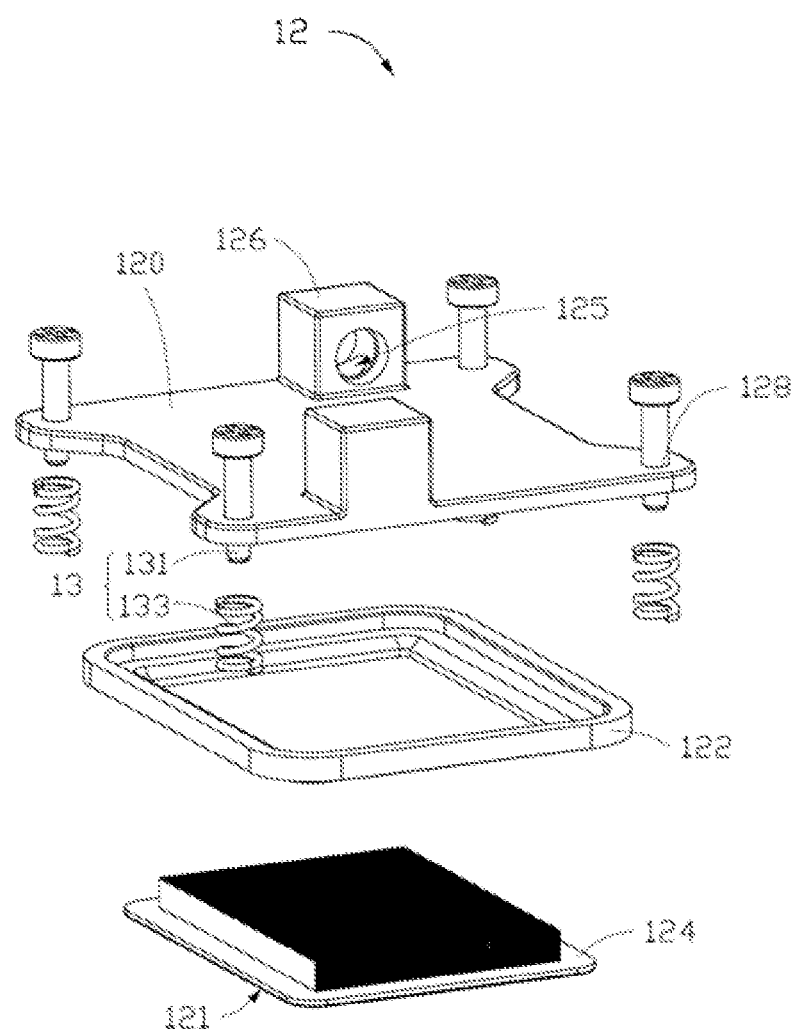
FIG. 3 is a schematic exploded view of a first heat dissipation module according to an embodiment of the present invention.
Figure 4:
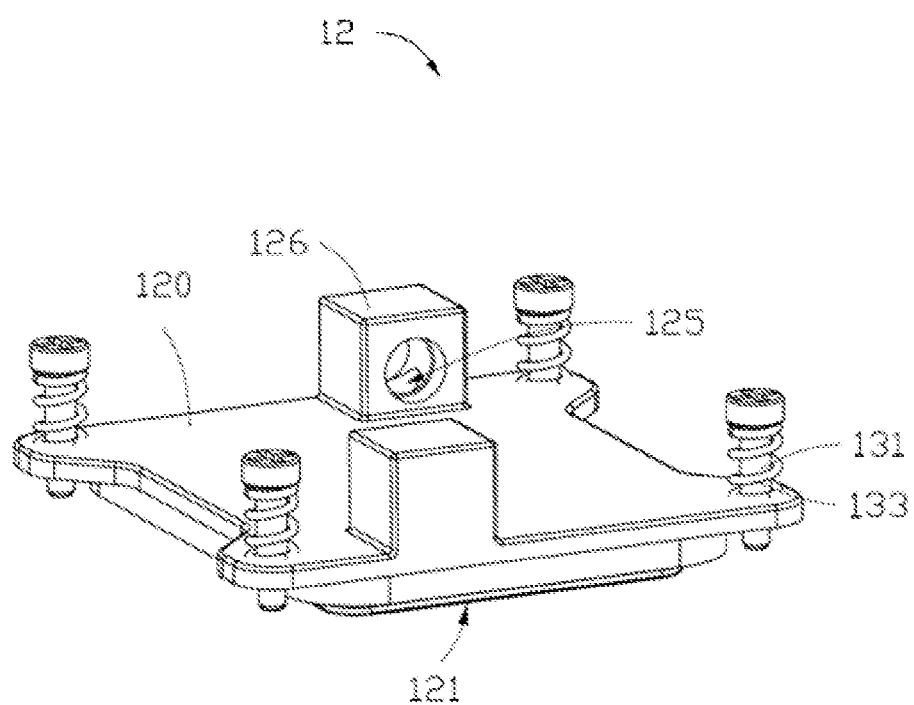
FIG. 4 is a schematic diagram of a structure of the first heat dissipation module shown in FIG. 3.

FIG. 3 and FIG. 4 are schematic diagrams of a structure of a first heat dissipation module according to an embodiment of the present invention. The first heat dissipation module includes a cover plate 120, a cooling cavity 122, and a cooling plate 124. The cooling cavity 122 is disposed between the cover plate 120 and the cooling plate 124, and the cover plate 120 and the cooling cavity 122 are fixedly connected to the cooling plate 124.

The cover plate 120 may be made of a material with good thermal conductivity, for example, a metal such as stainless steel or copper. The cover plate 120 is provided with a first working substance input/output interface 125 in communication with the cooling cavity 122. The first working substance input/output interface 125 is configured to connect to a liquid cooling circulation system. The liquid cooling circulation system includes, but is not limited to, a liquid cooling working substance driver configured to drive circulation of the liquid cooling working substance.

A liquid cooling channel accommodating the liquid cooling working substance is provided in the cooling cavity 122. The liquid cooling channel may be square, annular, or the like. In some embodiments, to improve a liquid cooling effect, the liquid cooling channel may further be set into a square waveform. An input/output interface connected to the first working substance input/output interface 125 is disposed on one side that is of the cooling cavity 122 and that faces the cover plate 120, so as to implement communication between the first working substance input/output interface 125 and the cooling cavity 122. It may be understood that, in some embodiments, the first working substance input/output interface 125 may be directly disposed on the cooling cavity 122, and is configured to connect to the liquid cooling circulation system. In this case, the working substance input/output interface is no longer disposed on the cover plate 120. To facilitate connection between the liquid cooling circulation system and the first working substance input/output interface 125, a first working substance connector 126 is disposed at the first working substance input/output interface 125. The first working substance connector 126 is disposed to implement quick connection to the liquid cooling circulation system.

The cooling plate 124 is made of a metal material with high thermal conductivity, for example, copper, stainless steel, or titanium. In some embodiments, the cooling plate 124 may form a part of a liquid cooling flow channel in the cooling cavity 122. In some embodiments, the cooling plate 124 may also be a solid structure. The cooling plate 124 includes a first thermally conductive surface 121 in thermal contact with the first heat source. The first thermally conductive surface 121 is disposed on one side away from the cooling cavity 122. The first thermally conductive surface 121 may be designed into a plane or a structure with a boss or a groove based on a surface shape of the first heat source.

In some embodiments, the cover plate 120, the cooling cavity 122, and the cooling plate 124 are fixedly connected by using a fixing structure such as a screw. It may be understood that, in some embodiments, the cover plate 120, the cooling cavity 122, and the cooling plate 124 are integrally formed into an integral structure.

The heat dissipation base 16 may be a metal substrate, and includes a second thermally conductive surface 161 facing the second heat source and a bearing surface 162 away from the second thermally conductive surface 161. The first heat dissipation module 12 and the second heat dissipation module 14 are both disposed on the bearing surface 162 of the heat dissipation base 16. The second thermally conductive surface 161 may be set into a matching shape based on a shape and a height of the second heat source, for example, may be a planar structure or a structure with a boss or a groove, so as to adapt to the height and the shape of the second heat source and form good thermal contact.

The second heat dissipation module 14 is fixedly disposed on the heat dissipation base 16. The second heat dissipation module 14 is also a liquid cooling structure. A liquid cooling cavity accommodating the liquid cooling working substance is provided in the second heat dissipation module 14. The liquid cooling cavity may be similar to the cooling cavity 122, and liquid cooling working substance flow channels of various appropriate shapes are disposed inside the liquid cooling cavity, so as to further improve a heat dissipation effect. A structure inside the liquid cooling cavity of the second heat dissipation module 14 is not specifically limited herein.

The second heat dissipation module 14 is in thermal contact with the heat dissipation base 16. In some embodiments, one side that is of the second heat dissipation module 14 and that is in contact with the heat dissipation base 16 is made of a metal material with good thermal conductivity. To further improve a heat conduction effect, a thermal interface material such as silicone grease is disposed between the second heat dissipation module 14 and the heat dissipation base 16. The second heat dissipation module 14 is provided with a second working substance input/output interface 142 for connecting to the liquid cooling circulation system (for example, a working substance driver). A second working substance connector 144 is disposed at the second working substance input/output interface 142. The second working substance connector 144 is disposed to facilitate quick connection to the liquid cooling circulation system.

A size of the second opening 140 is slightly greater than a size of the first heat dissipation module 12, so that the first heat dissipation module 12 can freely move (move up and down) in a direction perpendicular to the bearing surface 162 of the heat dissipation base 16. In this way, it is convenient to mount the first heat dissipation module 12 and the second heat dissipation module 14 onto the heat dissipation base 16.

The heat sink 1 is a split-type heat sink. The first heat dissipation module 12, the second heat dissipation module 14, and the heat dissipation base 16 are detachably connected together. The structure is simple, and is easy to mount. The first heat dissipation module 12 and the second heat dissipation module 14 are both disposed on the heat dissipation base 16, and do not need to occupy additional layout space of the circuit board. The first heat dissipation module 12 and the heat dissipation base 16 are respectively in thermal contact with the first heat source and the second heat source, so as to facilitate adjustment to adapt to chips and components with different heights. The heat dissipation base 16 is floatingly fixed on the circuit board 20, to effectively adjust pressure applied by the heat dissipation base 16 to the second heat source.

The first heat dissipation module 12 and the second heat dissipation module 14 both use a liquid cooling structure and are in communication with each other, to effectively improve heat dissipation efficiency. An area of thermal contact between the second heat dissipation module 14 and the heat dissipation base 16 is large, and heat generated by the second heat source 24 is effectively taken away.

Figure 5:
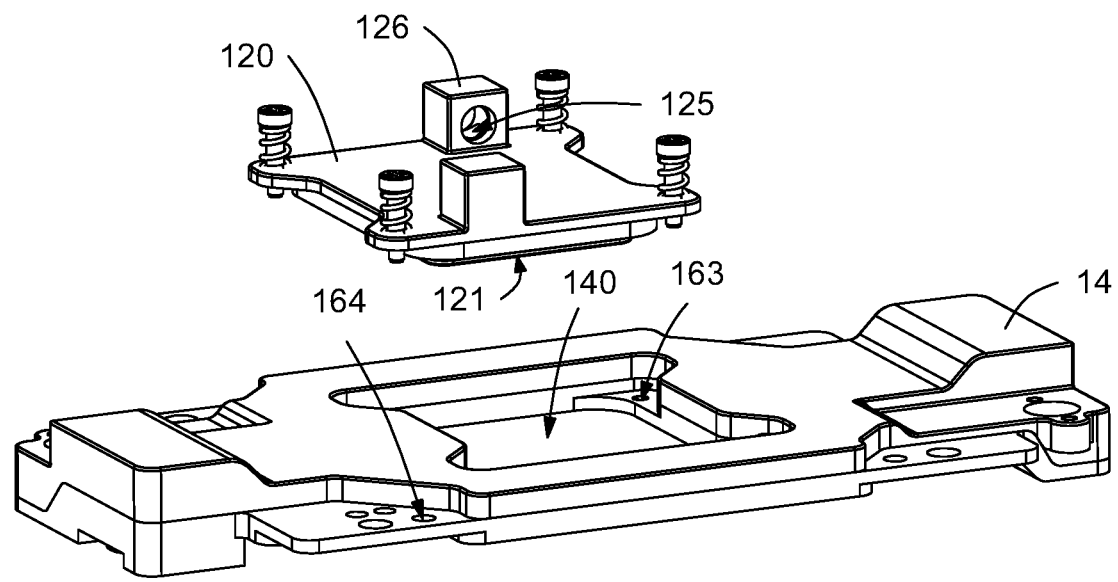
FIG. 5 is a schematic diagram of a structure of a first heat dissipation module mounted to a heat dissipation base according to an embodiment of the present invention.

In some embodiments, the first heat dissipation module 12 is floatingly fixed on the heat dissipation base 16, to further adjust pressure applied by the first heat dissipation module 12 to the first heat source, thereby avoiding unnecessary damage to a chip or a component. As shown in FIG. 5, the first heat dissipation module 12 is provided with a plurality of first positioning holes 128, the heat dissipation base 16 is provided with a plurality of second positioning holes 163, and a floating bolt 13 sequentially runs through the first positioning holes 128 and the second positioning holes 163, so as to fix the first heat dissipation module 12 on the heat dissipation base 16. The floating bolt 13 includes a stud 131 and an elastic member 133 disposed on the stud. An internal thread may be disposed in the second positioning hole 163, and an external thread may be disposed on the stud 131. The internal thread fits the external thread to fix the first heat dissipation module 12 on the heat dissipation base 16. After the first heat dissipation module 12 is fixed on the heat dissipation base 16, the elastic member 133 abuts between the first heat dissipation module 12 and the heat dissipation base 16. Due to elastic deformation of the elastic member 133, the first heat dissipation module 12 can float up and down relative to the heat dissipation base 16 within an elastic range of the elastic member 133, to adjust pressure applied to the first heat source.

The heat dissipation base 16 is further provided with third positioning holes 164, and the third positioning holes 164 are used to fix the circuit board. Similarly, the heat dissipation base 16 may also be floatingly fixed on the circuit board by using the foregoing floating bolt, so as to adjust pressure applied by the heat dissipation base 16 to the second heat source.

In some embodiments, the first heat dissipation module 12 and the second heat dissipation module 14 may be separately connected to the liquid cooling circulation system for heat dissipation. For example, the first heat dissipation module 12 is connected to the liquid cooling circulation system by using the first working substance input/output interface 125, and the liquid cooling working substance circulates in the liquid cooling circulation system to take away heat of the first heat source in thermal contact with the first heat dissipation module 12. The second heat dissipation module 14 is connected to the liquid cooling circulation system by using the second working substance input/output interface 142, and the liquid cooling working substance circulates in the liquid cooling circulation system to take away heat of the second heat source in thermal contact with the second heat dissipation module 14.

It may be understood that, in some embodiments, the first heat dissipation module 12 and the second heat dissipation module 14 may be further thermally communicated, and the second heat dissipation module 14 is fully used to perform further heat dissipation on the first heat source. As shown in FIG. 2, the second heat dissipation module is further provided with a third working substance input/output interface 143 in communication with the first working substance input/output interface 125 of the first heat dissipation module. The first heat dissipation module 12 and the second heat dissipation module 14 are in communication by using a flexible hose 17.

In a further embodiment, to enhance heat conduction between the second heat dissipation module 14 and the heat dissipation base 16, a first thermally conductive plate extending toward the second heat dissipation module 14 is disposed on the heat dissipation base 16. When the second heat dissipation module 14 is mounted on the heat dissipation base 16, the first thermally conductive plate is attached to the heat dissipation base 16, to increase an area of thermal contact between the heat dissipation base 16 and the second heat dissipation module 14.

Figure 6:
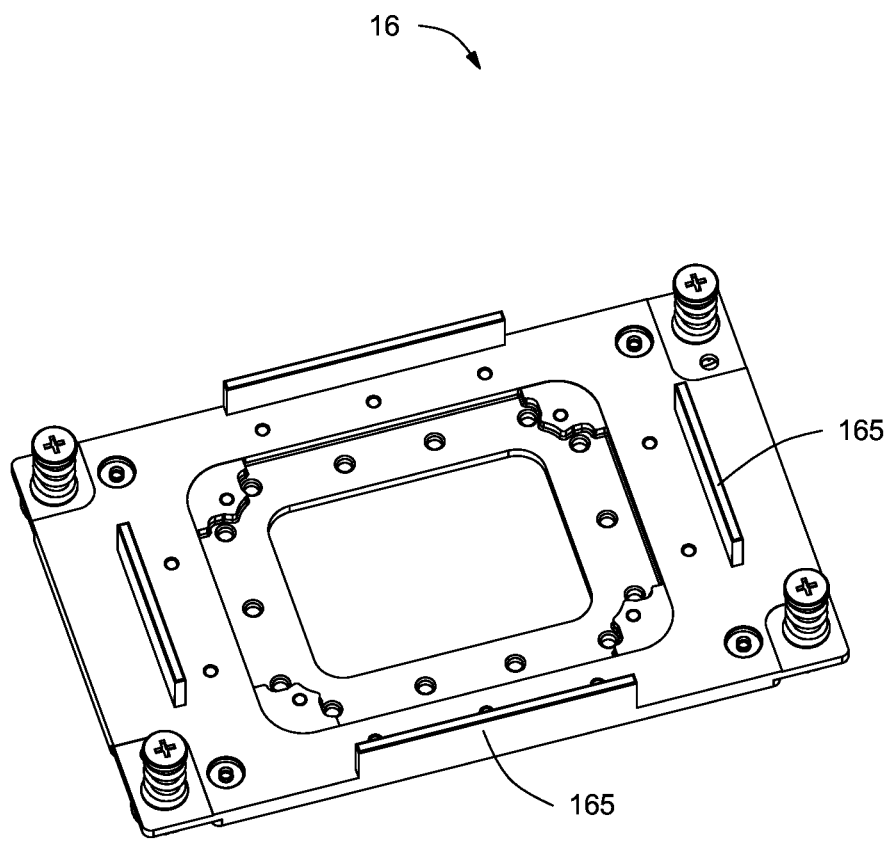
FIG. 6 is a schematic diagram of a structure of a heat dissipation base according to an embodiment of the present invention.

There may be one, two, or more than two first thermally conductive plates. FIG. 6 is a schematic diagram of a structure of a heat dissipation base 16 according to an embodiment of the present invention. Four first thermally conductive plates 165 are disposed on the heat dissipation base 16. The first thermally conductive plate 165 extends in a direction perpendicular to a bearing surface 162 of the heat dissipation base 16. The first thermally conductive plate 165 may be fixed on the bearing surface 162 of the heat dissipation base 16 by using a fixing structure such as a fastener or a screw. In some embodiments, the first thermally conductive plate 165 may also be integrally formed with the heat dissipation base 16.

When the second heat dissipation module 14 is disposed on the heat dissipation base 16, the first thermally conductive plate 165 is in thermal contact with an outer side wall of the second heat dissipation module 14, so as to increase an area of thermal contact between the heat dissipation base 16 and the second heat dissipation module 14. It may be understood that, a shape of the first thermally conductive plate 165 is not limited to a shape shown in the figure, and may be adaptively adjusted based on a shape of the outer side wall of the second heat dissipation module 14. It may be understood that, in some embodiments, a thermal interface material such as silicone grease may be further disposed between the first thermally conductive plate 165 and the outer side wall of the second heat dissipation module 14, to further improve heat conduction efficiency.

It may be understood that, in some embodiments, a second thermally conductive plate corresponding to the first thermally conductive plate 165 may be disposed on an outer side of the second heat dissipation module 14, and the second thermally conductive plate corresponds to a shape and a position of the first thermally conductive plate, so that heat conduction can be better implemented. Similarly, a thermal interface material such as silicone grease may also be disposed between the first thermally conductive plate and the second thermally conductive plate, to further improve heat conduction efficiency.

In a further embodiment, an elastic thermally conductive block may be further disposed between the first thermally conductive plate and the second thermally conductive plate, and the first thermally conductive plate is in thermal contact with the second thermally conductive plate by using the elastic thermally conductive block. The elastic thermally conductive block may not only provide buffer for relative displacement between the second heat dissipation module 14 and the heat dissipation base 16, but also further improve heat conduction efficiency.

Figure 7:
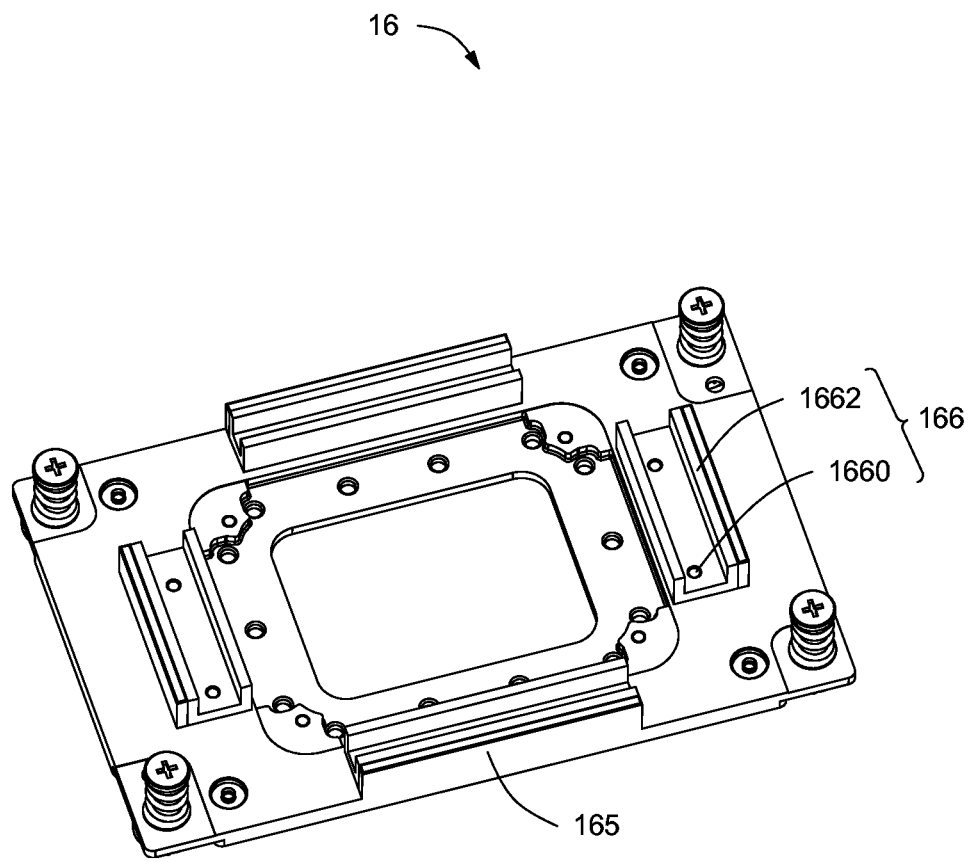
FIG. 7 is a schematic diagram of a structure of another heat dissipation base according to an embodiment of the present invention.

As shown in FIG. 7, four elastic thermally conductive blocks 166 are disposed on the heat dissipation base 16, and the elastic thermally conductive blocks 166 correspond to the first thermally conductive plates 165 in terms of position and abut against the first thermally conductive plates 165. In the embodiment shown in the figure, the elastic thermally conductive block 166 is U-shaped, and includes a fixing part 1660 fixedly connected to the bearing surface 162 of the heat dissipation base 16, and two connection parts 1662 extending from two opposite sides of the fixing part 1660. One connection part 1662 is in thermal contact with the first thermally conductive plate 165, and the other connection part 1662 is in thermal contact with the second heat dissipation module 14 (or the second thermally conductive plate). The two connection parts 1662 can perform elastic deformation under an action of external force, so as to provide buffer for relative displacement between the second heat dissipation module 14 and the heat dissipation base 16. It may be understood that, the elastic thermally conductive block is not limited to the U-shape shown in the figure, and may be any suitable structure, provided that the elastic thermally conductive block can elastically abut between the first thermally conductive plate 165 and the second heat dissipation module 14. The elastic thermally conductive block 166 may be fixedly disposed on the bearing surface 162 of the heat dissipation base 16 by using a fixing structure such as a fastener or a screw.

In a further embodiment, to further improve heat conduction efficiency between the heat dissipation base 16 and the second heat dissipation module 14, a heat pipe may be further disposed between the second heat dissipation module 14 and the heat dissipation base 16. One end of the heat pipe is connected to the second heat dissipation module 14, and the other end is connected to the heat dissipation base 16.

Figure 8:
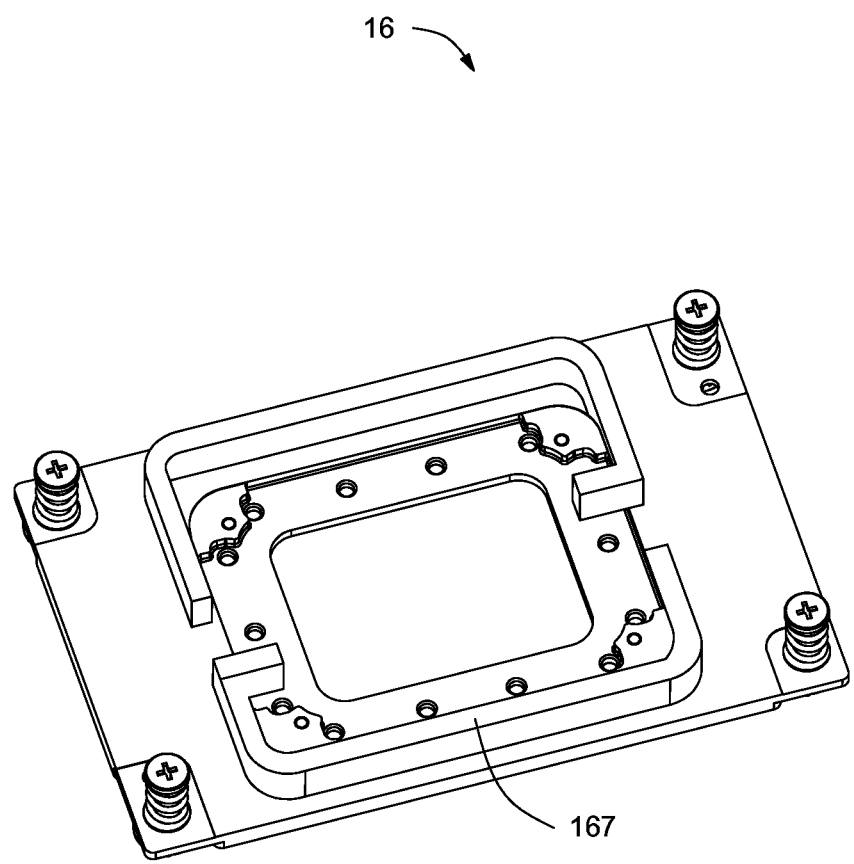
FIG. 8 is a schematic diagram of a structure of still another heat dissipation base according to an embodiment of the present invention.

As shown in FIG. 8, two heat pipes 167 are disposed on the heat dissipation base 16. The heat pipe 167 is U-shaped, and is deformable in a direction perpendicular to the bearing surface 162 of the heat dissipation base 16. In one aspect, the U-shaped heat pipe can increase an extension length of the heat pipe, and in a further aspect, the U-shaped heat pipe can provide buffer for relative displacement between the second heat dissipation module 14 and the heat dissipation base 16, to further adjust pressure applied by the heat dissipation base 16 to the peripheral device. One end (for example, a condensation end) of each heat pipe 167 is connected to the heat dissipation base 16, and the other end (for example, an evaporation end) is connected to the second heat dissipation module 14. Efficiency of heat conduction between the heat dissipation base 16 and the second heat dissipation module 14 is improved by using temperature uniformity of the heat pipe 167. It may be understood that, in another embodiment, a quantity of the heat pipes 167 is not limited to two shown in the figure, and may also be one, three, four, or another suitable quantity. A shape of the heat pipe 167 is not limited to the U-shape shown in the figure, and may be any suitable shape, for example, an L-shape or a Z-shape.

Figure 9:
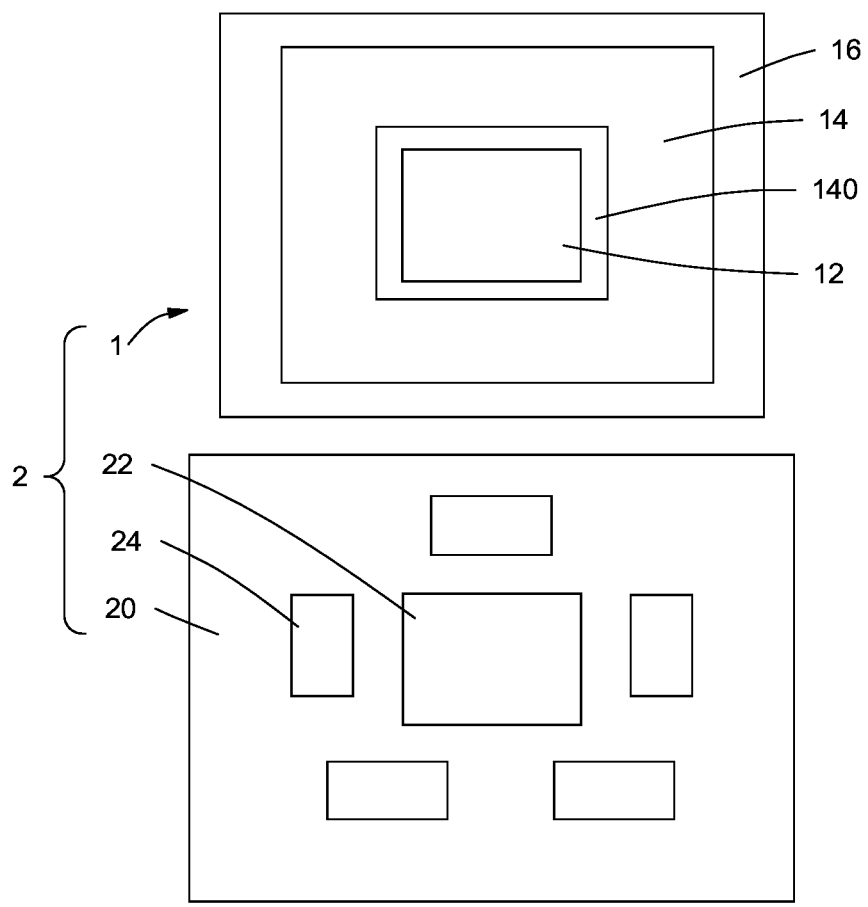
FIG. 9 is a schematic diagram of a structure of an electronic device according to an embodiment of the present invention.

FIG. 9 is a schematic diagram of a structure of an electronic device 2 according to an embodiment of the present invention. The electronic device 2 includes a circuit board 20, a first heat source 22 disposed on the circuit board 20, a plurality of second heat sources 24 disposed near the first heat source 22, and the heat sink 1 described in the foregoing embodiment.

The first heat source 22 is a high-power device, including but not limited to a central processing unit (CPU) and a network processing unit (NPU). The second heat source 24 may be a low-power chip or another electronic component, including but not limited to a storage component such as a double data rate (DDR) storage component, or a power supply component such as a voltage regulator down (VRD) module, a voltage regulator module (VRM), or a VDM.

The heat dissipation base 16 is floatingly fixed on the circuit board 20 by using a fixing apparatus such as a floating bolt, and the first heat dissipation module 12 is floatingly fixed on the heat dissipation base 16 by using a fixing apparatus such as a floating bolt. The second heat dissipation module 14 is fixedly disposed on the heat dissipation base 16.

The first heat dissipation module 12 of the heat sink 1 runs through the second opening 140 of the second heat dissipation module 14 and the first opening 160 of the heat dissipation base 16 (shown in FIG. 1) to be in thermal contact with the first heat source 22, and the heat dissipation base 16 is in thermal contact with the second heat source 24. In some embodiments, to improve heat conduction efficiency, a thermal interface material such as silicone grease may be further disposed between the first heat dissipation module 12 and the first heat source 22, and between the heat dissipation base 16 and the second heat source 24. If the plurality of second heat sources 24 have different heights, a thermal pad may be further disposed between the heat dissipation base 16 and the second heat sources 24. A size and a thickness of the thermal pad may be adjusted based on a distance between a thermally conductive surface of the second heat source 24 and a thermally conductive surface of the heat dissipation base 16, to ensure good thermal contact between the heat dissipation base 16 and the second heat source 24.

The electronic apparatus uses a split-type heat sink. The first heat dissipation module 12, the second heat dissipation module 14, and the heat dissipation base 16 are detachably connected together. The structure is simple, and is easy to mount. The first heat dissipation module 12 and the second heat dissipation module 14 are both disposed on the heat dissipation base 16, and do not need to occupy additional layout space of the circuit board 20. The first heat dissipation module 12 and the heat dissipation base 16 are respectively in thermal contact with the first heat source 22 and the second heat source 24, so as to facilitate adjustment to adapt to chips and components with different heights. The heat dissipation base 16 is floatingly fixed on the circuit board 20, to effectively adjust pressure applied by the heat dissipation base 16 to the second heat source 24. The first heat dissipation module 12 is floatingly fixed on the heat dissipation base 16, to further adjust pressure applied by the first heat dissipation module 12 to the first heat source 22, thereby avoiding unnecessary damage to a chip or a component.

The first heat dissipation module 12 and the second heat dissipation module 14 both use a liquid cooling structure and are in communication with each other, to effectively improve heat dissipation efficiency. An area of thermal contact between the second heat dissipation module 14 and the heat dissipation base 16 is large, and heat generated by the second heat source 24 is effectively taken away.

Figure 10:
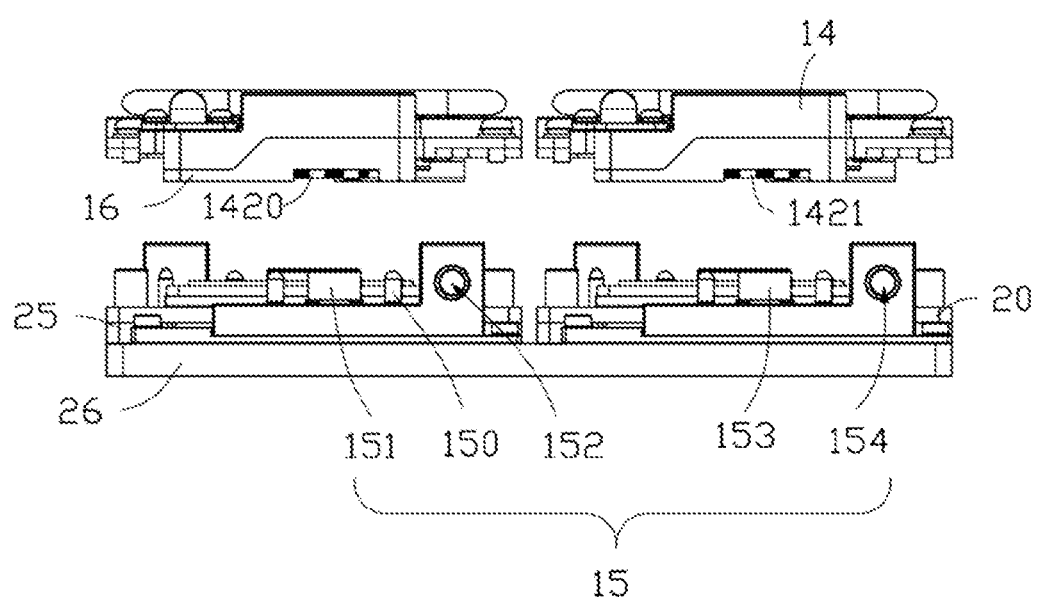
FIG. 10 is a schematic diagram of a cross-sectional structure of an electronic device according to an embodiment of the present invention.

FIG. 10 is a schematic diagram of a cross-sectional structure of an electronic device 2 according to an embodiment of the present invention. In this embodiment, the electronic device 2 includes a carrier plate 26, the circuit board 20 disposed on the carrier plate 26 by using a bracket 25, and the heat dissipation base 16 and the second heat dissipation module 14 that are disposed on the circuit board 20. A quick-connect apparatus 15 of the liquid cooling circulation system is disposed on the carrier plate 26. The quick-connect apparatus 15 is in communication with the second heat dissipation module 14, so that the liquid cooling working substance of the liquid cooling circulation system can flow into the second heat dissipation module 14 by using the quick-connect apparatus 15. The quick-connect apparatus 15 is fixedly disposed on the carrier plate 26 by using a locking apparatus 150 such as a shoulder screw. A positioning pin 155 is further disposed on the quick-connect apparatus 15, and the positioning pin 155 fits a corresponding structure on the second heat dissipation module 14, to implement quick positioning of the second heat dissipation module 14 and the quick-connect apparatus 15. The quick-connect apparatus 15 includes a first connector 151 and a second connector 153, and the second heat dissipation module 14 includes a third connector 1420 and a fourth connector 1421. The first connector 151 is in communication with the third connector 1420, and the second connector 153 is in communication with the fourth connector 1421. The quick-connect apparatus 15 is further provided with a fifth connector 152 and a sixth connector 154 that are configured to be in communication with the liquid cooling circulation system. The liquid cooling circulation system includes at least a liquid cooling working substance driver, for example, a driving pump. Therefore, the liquid cooling working substance in the liquid cooling circulation system can enter the quick-connect apparatus by using the fifth connector 152, and then flow into the second heat dissipation module 14 by using the first connector 151 and the third connector 1420. After the liquid cooling working substance circulates in the second heat dissipation module 14, the liquid cooling working substance flows back to the quick-connect apparatus 15 from the fourth connector 1421 and the second connector 153, and finally flows back to the liquid cooling circulation system from the sixth connector 154.

Figure 11:
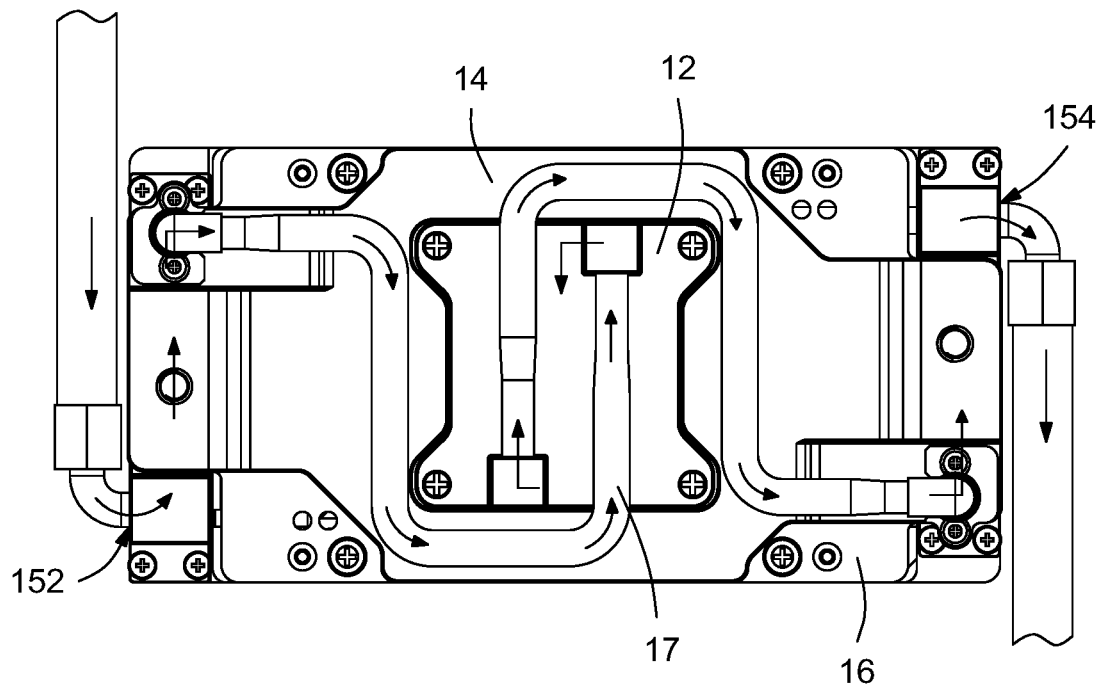
FIG. 11 is a schematic diagram of circulation of a liquid cooling working substance according to an embodiment of the present invention.
Figure 12:
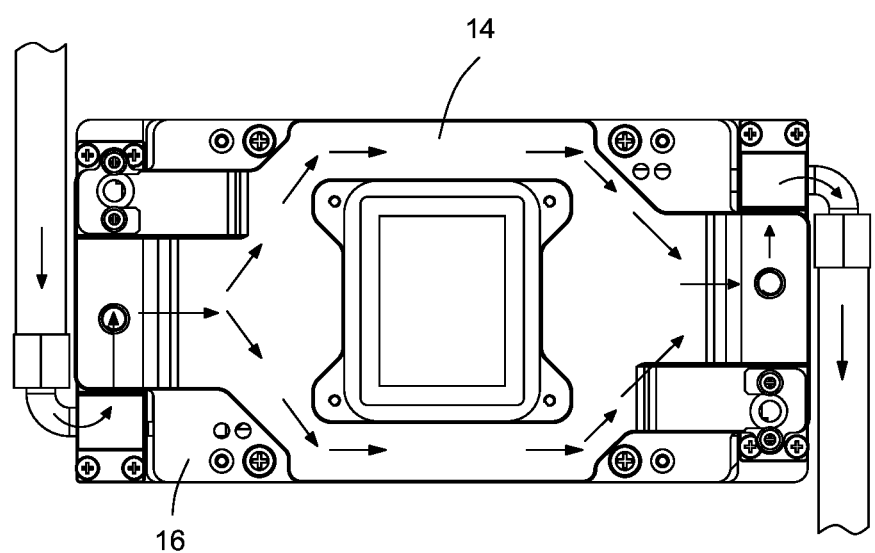
FIG. 12 is a schematic diagram of circulation of a liquid cooling working substance in the second heat dissipation module according to an embodiment of the present invention.

After the liquid cooling working substance flows into the second heat dissipation module 14, because the second heat dissipation module 14 is in communication with the first heat dissipation module 12, the liquid cooling working substance flows into the first heat dissipation module 12 through the second heat dissipation module 14, and then flows back to the quick-connect apparatus 15 through the second heat dissipation module 14. FIG. 11 and FIG. 12 are respectively a schematic diagram of circulation of the liquid cooling working substance between the quick-connect apparatus 15, the second heat dissipation module 14, and the first heat dissipation module 12, and a schematic diagram of circulation of the liquid cooling working substance in the second heat dissipation module 14. The liquid cooling working substance enters the second heat dissipation module 14 from the liquid cooling circulation system by using an input pipe and the quick-connect apparatus 15, then flows into the first heat dissipation module 12 through the flexible hose 17, then flows back to the second heat dissipation module 14 from the first heat dissipation module 12 through the flexible hose 17, flows back to the quick-connect apparatus 15 from the second heat dissipation module 14, and then flows back to the liquid cooling circulation system through the input pipe.

In this way, the first heat dissipation module 12 and the second heat dissipation module 14 are detachably connected to the liquid cooling circulation system by using the quick-connect apparatus 15, to implement structural decoupling, facilitate dismounting and mounting, and facilitate maintenance.

In some embodiments, connectors between the second heat dissipation module 14 and the quick-connect apparatus 15 use a structure of automatic connection and disconnection. To be specific, after the second heat dissipation module 14 and the heat dissipation base 16 are fixed on the carrier plate 26 by using a floating structure, the third connector 1420 of the second heat dissipation module 14 and the first connector 151 of the quick-connect apparatus 15 are automatically conducted, and the fourth connector 1421 of the second heat dissipation module 14 and the second connector 153 of the quick-connect apparatus 15 are automatically conducted. In this case, the liquid cooling working substance can circulate in the quick-connect apparatus 15 and the second heat dissipation module 14. When the second heat dissipation module 14 and the heat dissipation base 16 are removed from the carrier plate 26, the first connector 151 and the second connector 153 of the quick-connect apparatus 15 and the third connector 1420 and the fourth connector 1421 of the second heat dissipation module 14 are automatically closed. For ease of description, the following uses the first connector 151 and the corresponding third connector 1420 as an example for description.

Figure 13:
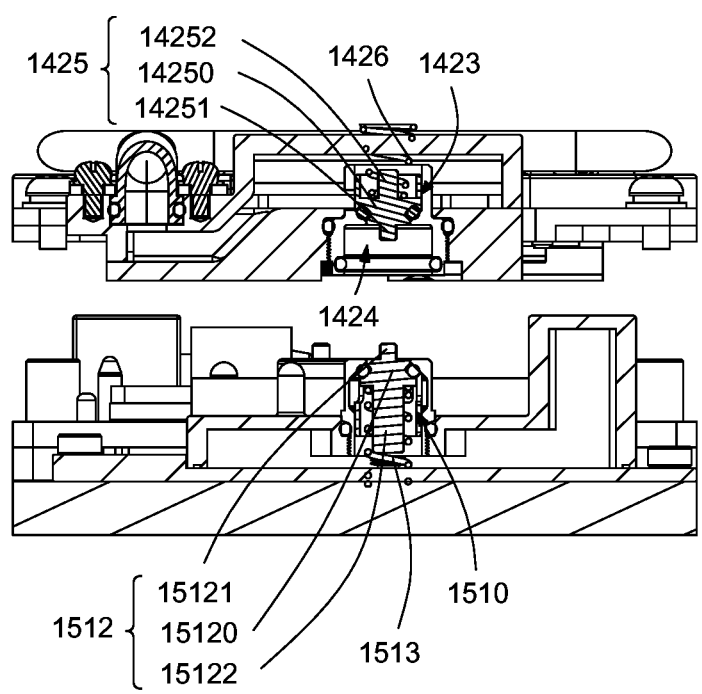
FIG. 13 is a schematic diagram of a structure in which a second heat dissipation module is not connected to a quick-connect apparatus according to an embodiment of the present invention.
Figure 14:
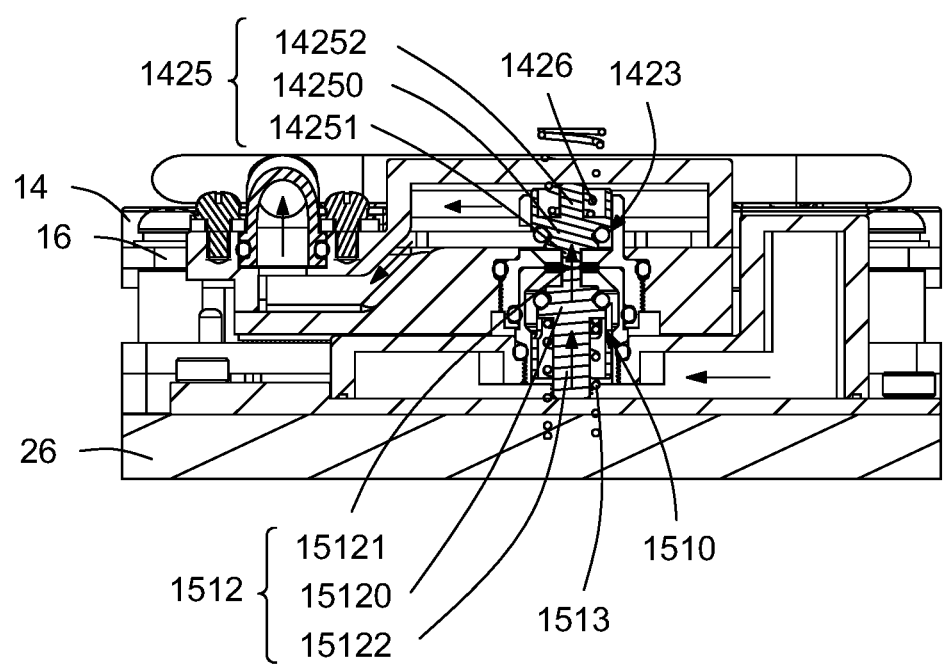
FIG. 14 is a schematic diagram of a structure of communication between the second heat dissipation module and the quick-connect apparatus that are shown in FIG. 13.

As shown in FIG. 13 and FIG. 14, the first connector 151 of the quick-connect apparatus 15 includes a first cavity 1510 and a first valve plug 1512. The first cavity 1510 includes a first inlet/outlet in communication with the fifth connector 152 and a second inlet/outlet corresponding to the third connector. When the first connector 151 is conducted, the liquid working substance flows into the quick-connect apparatus 15 from the fifth connector 152, and then enters the first cavity 1510 from the first inlet/outlet, and flows out of the first cavity 1510 from the second inlet/outlet. The first valve plug 1512 is disposed at the second inlet/outlet, and is fixed on a bottom wall of the first cavity 1510 by using a first elastic structure 1513. Under an elastic action of the first elastic structure 1513, the first valve plug 1512 can block the second inlet/outlet, and in this case, the first connector 151 is closed. The first valve plug includes a first blocking part 15120, a first abutting part 15121 disposed on one side that is of the first blocking part 15120 and that is away from the first elastic structure 1513, and a first connecting piece 15122 connected to the first elastic structure 1513. In the embodiment shown in the figure, the first connecting piece 15122 is a connecting rod, and the first elastic structure 1513 is a spring, and is sleeved on the first connecting piece 15122. An outer diameter of the first connecting piece 15122 is less than an outer diameter of the first blocking part 15120, so that the first elastic structure 1513 abuts against one side that is of the first blocking part 15120 and that is away from the first abutting part 15121. An outer diameter of the first abutting part 15121 is less than the outer diameter of the first blocking part 15120, and the first abutting part 15121 extends from the first blocking part 15120 in a direction away from the first cavity 1510. When the first abutting part 15121 is subject to external force, the first elastic structure 1513 is compressed, and the first blocking part 15120 exits from the second inlet/outlet. In this case, the first connector 151 is conducted.

The third connector 1420 of the second heat dissipation module 14 includes a second cavity 1423 and a third cavity 1424 that are in communication with each other. An inner diameter of the third cavity 1424 is greater than an inner diameter of the second cavity 1423. The first connector 151 can be partially accommodated in the third cavity 1424. The second cavity 1423 includes a third inlet/outlet in communication with the second heat dissipation module 14 and a fourth inlet/outlet connected to the third cavity 1424. A second valve plug 1425 is disposed at the fourth inlet/outlet. The second valve plug 1425 is fixed on a bottom wall of the second cavity 1423 by using a second elastic structure 1426. Under an elastic action of the second elastic structure 1426, the second valve plug 1425 can be blocked at the fourth inlet/outlet. In this case, the third connector 1420 is closed. A structure of the second valve plug 1425 is similar to that of the first valve plug 1512, and includes a second blocking part 14250, a second abutting part 14251 disposed on one side that is of the second blocking part 14250 and that is away from the second elastic structure 1426, and a second connecting piece 14252 connected to the second elastic structure 1426. In the embodiment shown in the figure, the second connecting piece 14252 is a connecting rod, and the second elastic structure 1426 is a spring, and is sleeved on the connecting rod. An outer diameter of the second connecting piece 14252 is less than an outer diameter of the second blocking part 14250, so that the second elastic structure 1426 abuts against one side that is of the second blocking part 14250 and that is away from the second abutting part 14251. An outer diameter of the second abutting part 14251 is less than the outer diameter of the second blocking part 14250, and the second abutting part 14251 extends from the second blocking part 14250 towards inside of the third cavity 1424. When the second abutting part 14251 is subject to external force, the second blocking part 14250 exits from the fourth inlet/outlet, and the second elastic structure 1426 is compressed. In this case, the third connector 1420 is conducted.

FIG. 13 shows a state in which the second heat dissipation module 14 is disconnected from the quick-connect apparatus 15. In this case, the first valve plug 1512 is blocked at the second inlet/outlet of the first cavity 1510 under an action of the first elastic structure 1513, and the first connector 151 is closed. The second valve plug 1425 is blocked at the fourth inlet/outlet of the second cavity 1423 under an action of the second elastic structure 1426, and the third connector 1420 is closed.

As shown in FIG. 14, after the second heat dissipation module 14 and the heat dissipation base 16 are fixed on the carrier plate 26, the first connector 151 is partially accommodated in the third cavity 1424, the first abutting part 15121 and the second abutting part 14251 abut against each other, the first blocking part 15120 exits from the outlet of the first cavity 1510, and the first connector 151 is conducted. The second blocking part 14250 exits from the inlet of the second cavity 1423, and the third connector 1420 is conducted. In this case, the liquid cooling working substance can enter the third cavity 1424 and the second cavity 1423 through the first cavity 1510, and then enter the second heat dissipation module 14.

A sealing structure such as a sealing ring is disposed in the third cavity 1424, to avoid liquid cooling working substance leakage when the first connector 151 is accommodated in the third cavity 1424 and is conducted.

The first connector 151 of the quick-connect apparatus 15 and the third connector 1420 of the second heat dissipation module 14 are automatically conducted respectively by using the first valve plug 1512 and the second valve plug 1425 when being connected, and are automatically closed when being disconnected. The structure is simple, and is easy to implement.

It may be understood that, the second connector 153 and the fourth connector 1421 may also use a structure similar to that of the first connector 151 and the third connector 1420, to implement automatic conduction and automatic closing.

It may be understood that, in another embodiment, before the second heat dissipation module 14 is connected to the liquid cooling circulation system by using the quick-connect apparatus 15, the second heat dissipation module 14 is not filled with a liquid working substance, and the foregoing automatic closing structure may not be used. That is, the third connector 1420 and the fourth connector 1421 of the second heat dissipation module 14 may not use the foregoing structure, provided that the third connector 1420 can push against the first valve plug 1512 to automatically conduct the first connector 151 and the third connector 1420 when the third connector 1420 is connected to the first connector 151. For example, a pushing part that can push against the first valve plug 1512 is disposed in the third connector 1420. When the first connector 151 is connected and fixed to the third connector 1420, the pushing part of the third connector 1420 pushes against the first valve plug 1512 to conduct the first connector 151 and the third connector 1420.

It may be understood that, in another embodiment, alternatively, a fourth cavity in communication with the first cavity 1510 may be disposed on the first connector 151, the third cavity 1424 may not be disposed on the third connector 1420, and when the first connector 151 is connected and fixed to the third connector 1420, the third connector 1420 is partially accommodated in the fourth cavity. It may be understood that, in another embodiment, the first connector 151 and the third connector 1420, and the second connector 153 and the fourth connector 1421 may also be connected by using another fitting structure, for example, a fastener, provided that sealed conduction is enabled when the first connector 151 is correspondingly connected and fixed to the third connector 1420, and the second connector 153 is correspondingly connected and fixed to the fourth connector 1421.

The foregoing descriptions are merely specific implementations of this disclosure, but are not intended to limit the protection scope of this disclosure. Any variation or replacement within the technical scope disclosed in this disclosure shall fall within the protection scope of this disclosure. Therefore, the protection scope of this disclosure shall be subject to the protection scope of the claims.

What is claimed is:

1. A heat sink, configured for use in an electronic device, wherein the electronic device comprises a first heat source and a second heat source that are disposed on a circuit board, the heat sink comprising:
    a first heat dissipation module in thermal contact with the first heat source;
    a heat dissipation base in thermal contact with the second heat source, wherein the heat dissipation base is fixed on the circuit board, the first heat dissipation module is floatingly disposed on the heat dissipation base, and the heat dissipation base is provided with a first opening; and
    a second heat dissipation module, disposed between the first heat dissipation module and the heat dissipation base, wherein the second heat dissipation module is fixed on the heat dissipation base, the second heat dissipation module is provided with a second opening at least partially aligned with the first opening, and the first heat dissipation module sequentially extends through the second opening and the first opening to be in thermal contact with the first heat source.

2. The heat sink according to claim 1, wherein the first heat dissipation module and the second heat dissipation module are both liquid cooling structures.

3. The heat sink according to claim 2, wherein the first heat dissipation module comprises a cover plate, a cooling cavity, and a cooling plate, the cooling cavity is disposed between the cover plate and the cooling plate, the cover plate is connected to the cooling plate, and the cover plate is provided with a first working substance input/output interface in communication with the cooling cavity.

4. The heat sink according to claim 3, wherein the second heat dissipation module is provided with a second working substance input/output interface, and the first working substance input/output interface is in communication with the second working substance input/output interface by using a hose.

5. The heat sink according to claim 3, wherein the second heat dissipation module is further provided with another working substance input/output interface, and the another working substance input/output interface is configured to connect to an external working substance circulation system.

6. The heat sink according to claim 5, wherein the another working substance input/output interface is connected to a connector, the connector comprises a first cavity and a first valve plug disposed at an inlet/outlet of the first cavity, the first valve plug is connected to a bottom wall of the first cavity by using a first elastic structure, the first valve plug is configured to be blocked at the inlet/outlet of the first cavity under an abutting action of the first elastic structure to make the connector closed, and the first valve plug is configured to exit from the inlet/outlet of the first cavity under an action of external force to conduct the connector.

7. The heat sink according to claim 1, wherein the heat dissipation base is provided with a first thermally conductive plate, the second heat dissipation module is provided with a second thermally conductive plate, and the first thermally conductive plate is in thermal contact with the second thermally conductive plate.

8. The heat sink according to claim 7, wherein an elastic thermally conductive block is further disposed between the first thermally conductive plate and the second thermally conductive plate, and the first thermally conductive plate is in thermal contact with the second thermally conductive plate by using the elastic thermally conductive block.

9. The heat sink according to claim 8, wherein the elastic thermally conductive block is U-shaped.

10. The heat sink according to claim 1, wherein a heat pipe is disposed between the second heat dissipation module and the heat dissipation base, one end of the heat pipe is connected to the second heat dissipation module, and an other end is connected to the heat dissipation base.

11. The heat sink according to claim 10, wherein the heat pipe is U-shaped and is deformable in a direction perpendicular to a thermally conductive surface of the heat dissipation base.

12. The heat sink according to claim 1, wherein the first heat dissipation module is in thermal contact with the first heat source by using a thermal interface material; and the heat dissipation base is in thermal contact with the second heat source by using a thermal pad.

13. The heat sink according to claim 1, wherein the first heat dissipation module is floatingly disposed on the heat dissipation base by using a floating bolt.

14. An electronic device comprising:
a circuit board,
a first heat source and a second heat source that are disposed on the circuit board, and
a heat sink that comprises:
a first heat dissipation module in thermal contact with the first heat source;
a heat dissipation base in thermal contact with the second heat source, wherein the heat dissipation base is fixed on the circuit board, the first heat dissipation module is floatingly disposed on the heat dissipation base, and the heat dissipation base is provided with a first opening; and
a second heat dissipation module, disposed between the first heat dissipation module and the heat dissipation base, wherein the second heat dissipation module is fixed on the heat dissipation base, the second heat dissipation module is provided with a second opening at least partially aligned the first opening, and the first heat dissipation module sequentially extends through the second opening and the first opening to be in thermal contact with the first heat source.

15. The electronic device according to claim 14, wherein the first heat dissipation module and the second heat dissipation module are both liquid cooling structures.

16. The electronic device according to claim 15, wherein the first heat dissipation module comprises a cover plate, a cooling cavity, and a cooling plate, the cooling cavity is disposed between the cover plate and the cooling plate, the cover plate is connected to the cooling plate, and the cover plate is provided with a first working substance input/output interface in communication with the cooling cavity.

17. The electronic device according to claim 16, wherein the second heat dissipation module is provided with a second working substance input/output interface, and the first working substance input/output interface is in communication with the second working substance input/output interface by using a hose.

18. The electronic device according to claim 16, wherein the second heat dissipation module is further provided with another working substance input/output interface, and the another working substance input/output interface is configured to connect to an external working substance circulation system.

19. The electronic device according to claim 18, wherein the another working substance input/output interface is connected to a connector, the connector comprises a first cavity and a first valve plug disposed at an inlet/outlet of the first cavity, the first valve plug is connected to a bottom wall of the first cavity by using a first elastic structure, the first valve plug is configured to be blocked at the inlet/outlet of the first cavity under an abutting action of the first elastic structure to make the connector closed, and the first valve plug is configured to exit from the inlet/outlet of the first cavity under an action of external force to conduct the connector.

20. The electronic device according to claim 14, wherein the first heat source is a chip; and the second heat source comprises a storage element and/or a power supply device.

* * * * *